United States Patent
Guo et al.

(10) Patent No.: US 9,136,231 B2
(45) Date of Patent: Sep. 15, 2015

(54) CARRIER-FREE LAND GRID ARRAY IC CHIP PACKAGE AND PREPARATION METHOD THEREOF

(75) Inventors: Xiaowei Guo, Gansu (CN); Wenhai He, Gansu (CN); Wei Mu, Gansu (CN); Xinjun Wang, Gansu (CN)

(73) Assignee: TIANSHUI HUATIAN TECHNOLOGY CO., LTD., Tianshui, Gansu (CN)

(*) Notice: Subject to any disclaimer, the term of this patent is extended or adjusted under 35 U.S.C. 154(b) by 174 days.

(21) Appl. No.: 13/883,936

(22) PCT Filed: Dec. 30, 2010

(86) PCT No.: PCT/CN2010/080548
§ 371 (c)(1),
(2), (4) Date: May 7, 2013

(87) PCT Pub. No.: WO2012/068763
PCT Pub. Date: May 31, 2012

(65) Prior Publication Data
US 2013/0334686 A1 Dec. 19, 2013

(30) Foreign Application Priority Data
Nov. 26, 2010 (CN) .......................... 2010 1 0561310

(51) Int. Cl.
*H01L 23/00* (2006.01)
*H01L 23/495* (2006.01)
*H01L 23/31* (2006.01)

(52) U.S. Cl.
CPC ............ *H01L 24/05* (2013.01); *H01L 23/4951* (2013.01); *H01L 23/49541* (2013.01);

(Continued)

(58) Field of Classification Search
CPC .......... H01L 24/05; H01L 24/03; H01L 23/00
USPC .................. 257/741, 690, 691, 697, E23.061; 438/111–113, 123, 106
See application file for complete search history.

(56) References Cited

U.S. PATENT DOCUMENTS 5,851,664 A * 12/1998 Bennett et al. .......... 428/355 BL
6,030,485 A * 2/2000 Yamada ........................ 156/701

(Continued)

FOREIGN PATENT DOCUMENTS

CN 2711906 Y 7/2005
CN 101847614 A 9/2010

*Primary Examiner* — Sheng Zhu
(74) *Attorney, Agent, or Firm* — Hamre, Schumann, Mueller & Larson, P.C.

(57) ABSTRACT

A carrier-free land grid array (LGA) Integrated Circuit (IC) chip package and a preparation method thereof are provided. The IC chip package includes: an inner pin, an IC chip, a pad, a bonding wire, and a mold cap. The inner pin is designed to be a multi-row matrix form at a front side of the package, and is designed to be an exposed multi-row approximate square-shaped circular gold-plated contacts at a back side; the IC chip is provided on the inner pin, the inner pin is adhered to the IC chip with an adhesive film sheet, the pad on the IC chip is connected to the inner pin by the bonding wire, and the mold cap encircles the adhesive film sheet, the IC chip, the bonding wire, and edges of the inner pin, so as to form a whole circuit. The present invention adopts approximate square-shaped spherical array contacts, thereby having a simple and flexible structure, and achieving a desirable heat-dissipation effect. A cooper lead frame (L/F) has a high yield, and reduces the material cost. The L/F is used to replace a ceramic substrate, PCB substrate, or BT substrate, thereby saving the complicated layout design, shortening the designing and manufacturing cycle, accelerating the trial production course, and enabling the product to be early listed to obtain market opportunities.

7 Claims, 5 Drawing Sheets

(52) U.S. Cl.
CPC .... *H01L23/49548* (2013.01); *H01L 23/49575* (2013.01); *H01L 24/03* (2013.01); *H01L 24/97* (2013.01); *H01L 23/3107* (2013.01); *H01L 24/32* (2013.01); *H01L 24/48* (2013.01); *H01L 24/49* (2013.01); *H01L 24/73* (2013.01); *H01L 24/85* (2013.01); *H01L 24/92* (2013.01); *H01L 2223/54486* (2013.01); *H01L 2224/04042* (2013.01); *H01L 2224/2919* (2013.01); *H01L 2224/32145* (2013.01); *H01L 2224/32245* (2013.01); *H01L 2224/48091* (2013.01); *H01L 2224/48137* (2013.01); *H01L 2224/48145* (2013.01); *H01L 2224/48247* (2013.01); *H01L 2224/49171* (2013.01); *H01L 2224/73265* (2013.01); *H01L 2224/85444* (2013.01); *H01L 2224/92247* (2013.01); *H01L 2224/97* (2013.01); *H01L 2924/15747* (2013.01)

(56) References Cited

U.S. PATENT DOCUMENTS

| | | | | |
|---|---|---|---|---|
| 6,152,353 | A * | 11/2000 | Sani-Bakhtiari et al. | 228/180.1 |
| 6,165,885 | A * | 12/2000 | Gaynes et al. | 438/612 |
| 6,524,891 | B1 * | 2/2003 | Jiang | 438/118 |
| 7,023,098 | B2 * | 4/2006 | Umeno et al. | 257/787 |
| 7,608,482 | B1 * | 10/2009 | Bayan | 438/112 |
| 7,806,994 | B2 * | 10/2010 | Smith et al. | 148/400 |
| 7,994,629 | B2 * | 8/2011 | Camacho | 257/690 |
| 2004/0104457 | A1 * | 6/2004 | Tan et al. | 257/666 |
| 2011/0111563 | A1 * | 5/2011 | Yanagi et al. | 438/118 |

* cited by examiner

CARRIER-FREE LAND GRID ARRAY IC CHIP PACKAGE AND PREPARATION METHOD THEREOF

BACKGROUND OF THE INVENTION

1. Field of Invention

The present invention belongs to the field of manufacturing technologies of electronic information automation devices, relates to an Integrated Circuit (IC) chip package, and more particularly to a carrier-free pinless land grid array (LGA) IC chip package; the present invention further relates to a preparation method of the package.

2. Related Art

Land Grid Array (LGA) package is fine-pitch chip-scale package based on a laminated substrate. The LGA replaces the old Pin Grid Array (PGA) through the metal-contact packaging technology, and realizes a progressive technological revolution. A ceramic substrate, a Printed Circuit Board (PCB) substrate, or a Bismaleimide Triazine (BT) substrate is generally used in the PGA packaging technology (unclear logical relation), the layout structural design thereof is complicated, and the cost of the ceramic substrate, the PCB substrate, or the BT substrate is high; moreover, the substrate has low production yield, long manufacturing cycle, and poor heat-dissipation effect.

SUMMARY OF THE INVENTION

To solve the problems of complicated frame layout structural design, the low yield, and the high material cost in the existing PGA technology, the present invention provides a flat carrier-free pinless LGA IC chip package which saves the complicated layout design, achieves a high yield by using a copper lead frame (L/F), and has a low material cost and a short manufacturing cycle. The present invention further provides a preparation method of the IC chip package.

The present invention adopts the following technical solutions.

A carrier-free LGA IC chip package and a preparation method thereof are provided. The IC chip package includes an inner pin, an adhesive film sheet is provided on the inner pin, an IC chip is provided on the adhesive film sheet, a pad on the IC chip is connected to the inner pin by a bonding wire, and a mold cap encircles the adhesive film sheet, the IC chip, the bonding wire, and edges of the inner pin; the inner pin is designed to be multi-row matrix inner pins and exposed multi-row approximate square-shaped circular gold-plated contacts.

The multi-row matrix inner pins are designed to be pins of three rows being A, B and C. Three inner pins are disposed in the row A, which are respectively A1, A2, and A3; two inner pins B1 and B2 are disposed at the left of the row B and are connected together, and one separate inner pin B3 is disposed at the right of the row B; three separate inner pins C1, C2, and C3 are disposed at the row C.

The exposed multi-row approximate square-shaped circular gold-plated contacts are disposed as follows: three separate approximate square-shaped circular pin contacts a1, a2, and a3 of the same size are disposed in the row A at a back side of the package; three separate approximate square-shaped circular contacts b1, b2, and b3 are disposed in the row B, where a top left corner of b2 forms an oblique angle of 0.10×45°, and the row-A contact directly facing the oblique angle is Pin 1 of the circuit; three separate approximate square-shaped circular contacts c1, c2, and c3 of the same size are further disposed in the row C.

The package has a single-chip package form.

The package has a multi-chip package form.

The package has a dual-chip staking package form. Another IC chip is disposed on the original IC chip, an adhesive film sheet is disposed between the IC chips to bind the IC chips, the pad on the original IC chip is connected to the inner pin by the bonding wire, and another pad on the original IC chip is connected to the IC chip disposed on the original IC chip by another bonding wire, so as to form a current and signal channel of the circuit; the mold cap encircles the adhesive film sheet, the IC chips, the bonding wires, and edges of the inner pin, so as to form a whole circuit.

A production method of the single-chip package includes: wafer grinding, sawing, die bonding, wiring bonding, molding, post mold curing, marking, cutting and separation, inspection, packing, and putting in storage, where the post mold curing, the marking, the packing, and the putting in storage are performed in a way the same as that in ordinary Quad Flat No-lead Package (QFN) production, and the rest operations are performed according to the following process steps.

Grinding and Sawing

First a wafer is ground to the thickness of 150 μm-200 μm, cleaned and dried, and then an adhesive film sheet is adhered at the back; a grinding adhesive film is removed, and then the wafer adhered with the adhesive film sheet is sawed into single chips, where only the adhesive film layer is cut thoroughly without hurting a protective layer.

Die Bonding

The chip is automatically set at a midpoint of an L/F position on a dedicated die bonder of the adhesive film sheet, and is heated; then the IC chip is adhered to edges of the inner pins at the row B and several other inner pins, and is firmly adhered after baking.

Wiring Bonding

In the current package, the pad on the IC chip is close to inner pin solder joints, and a slightly bent bonding wire is used accordingly.

Molding

The molding adopts an automatic molding system Y-series E60T, uses CEL9220HF10TS-series environmental-protection molding compounds, and has the following process conditions:

the mold temperature (° C.): 165-185; the clamping pressure (Ton): 35-55; the injection pressure (Ton): 0.75-1.33; the injection time (s): 6-15; and the curing time (s): 90-120;

the post mold curing is performed by using a QFN curing oven at the temperature of 150° C. for 7 hours.

Cutting

A dedicated NLGA1/NLGA2 cutting fixture of the product is used, and the cutting is performed according to the common QFN cutting process.

The grinding, sawing, molding, marking, and cutting of the multi-chip package are the same as those of the single-chip package, and the rest steps are as follows:

Die Bonding

The chip is automatically set at a position of the corresponding L/F inner pin on a dedicated die bonder of the adhesive film sheet, and is heated; then the IC chip is adhered to edges of the inner pins at the middle row and several other inner pins, and is firmly adhered after baking.

Wiring Bonding

A slightly bent bonding wire is used.

The grinding, sawing, marking, and cutting of the dual-chip stacked package are the same as those of the single-chip package, and the rest steps are as follows:

Die Bonding

The chip is automatically set at a position of the corresponding L/F inner pin on a dedicated die bonder of the adhesive film sheet, and is heated; then the IC chip 6 is adhered to edges of the inner pins at the middle row and several other inner pins; after the first-time die bonding is completed, the same way is applied on the IC chip 6, and an IC chip 9 with an adhesive film sheet is adhered to the IC chip 6, and is firmly adhered after baking.

Wiring Bonding

A slightly bent bonding wire is used.

Molding

The molding adopts an automatic molding system Y-series E60T, uses CEL9220HF10TS-series environmental-protection molding compounds, and has the following process conditions:

the mold temperature (° C.): 165-185; the clamping pressure (Ton): 35-55; the injection pressure (Ton): 0.75-1.33; the injection time (s): 6-15; and the curing time (s): 90-120; and the post mold curing is performed by using a QFN curing oven at the temperature of 150° C. for 7 hours.

The present invention adopts approximate square-shaped spherical array contacts, thereby having a simple and flexible structure, and achieving a desirable heat-dissipation effect. The cooper L/F has a high yield and high material utilization, and reduces the material cost. The L/F is used to replace the ceramic substrate, the PCB substrate, or the BT substrate, thereby saving the complicated layout design, shortening the designing and manufacturing cycle, accelerating the trial production course, and enabling the product to be early listed to obtain market opportunities.

Figure 1:
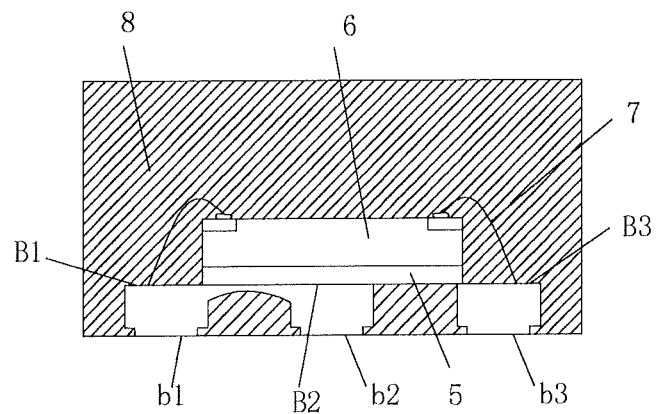
FIG. 1 is a schematic structural view of a single chip of an IC chip package of the present invention.
Figure 2:
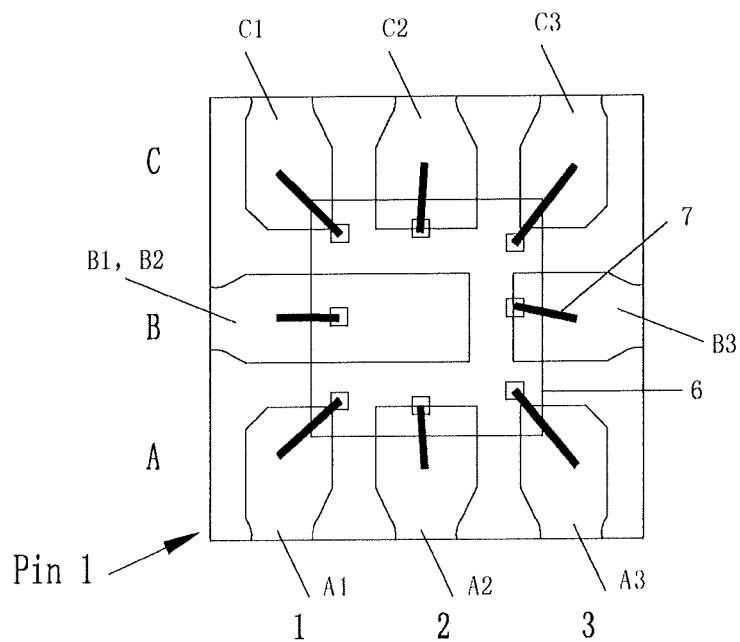
FIG. 2 is a top view of FIG. 1.
Figure 3:
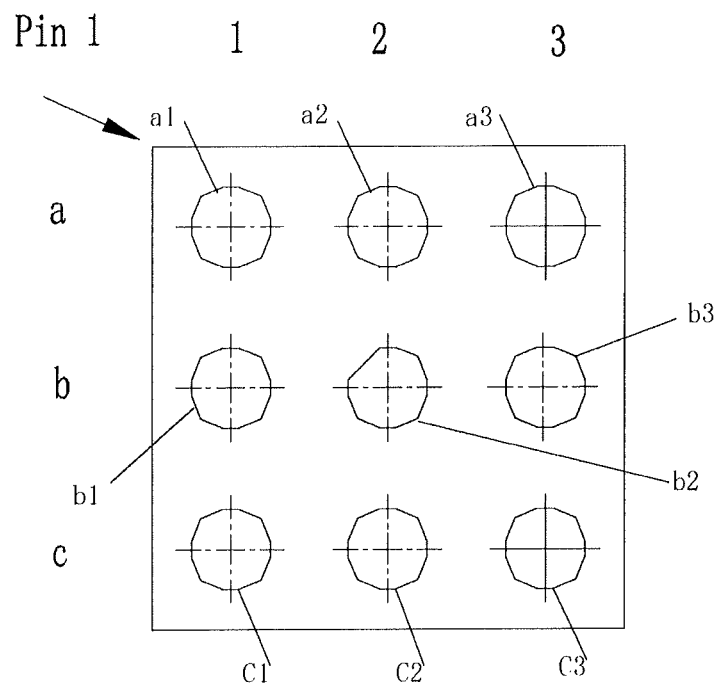
FIG. 3 is a bottom view of FIG. 1.
Figure 4:
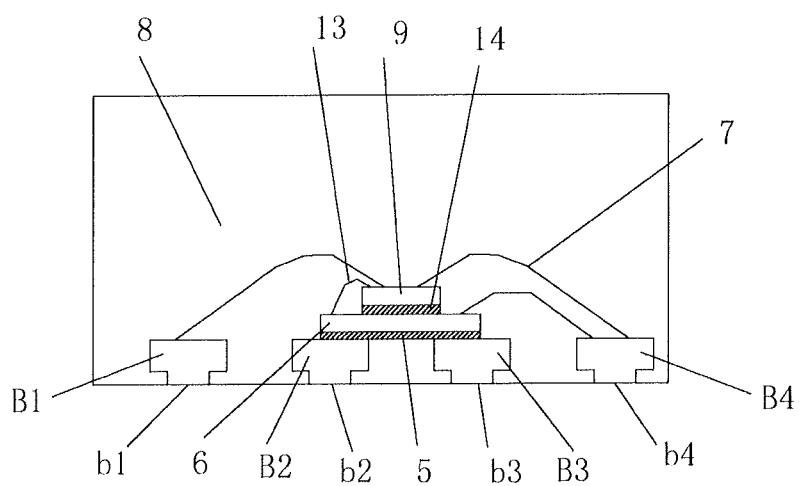
FIG. 4 is a schematic structural view of an embodiment showing stacking packaging of the IC chip package of the present invention.
Figure 5:
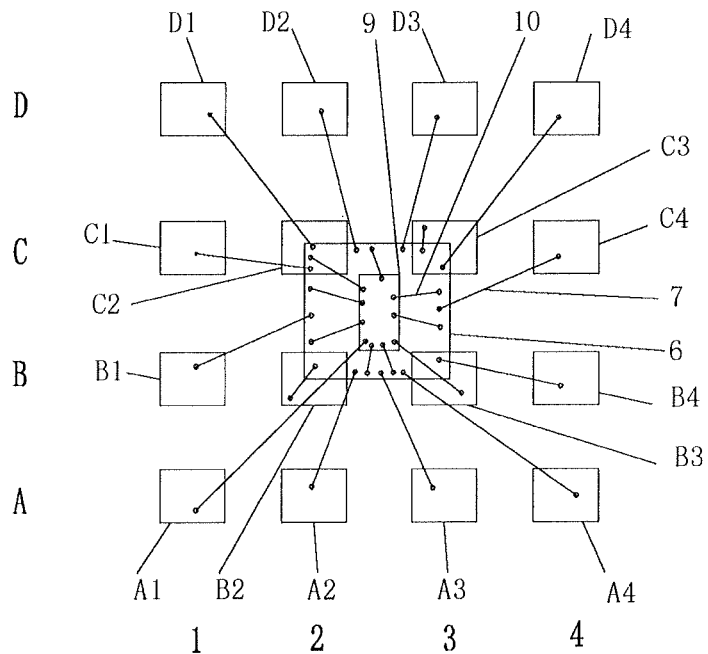
FIG. 5 is a top view of FIG. 4.
Figure 6:
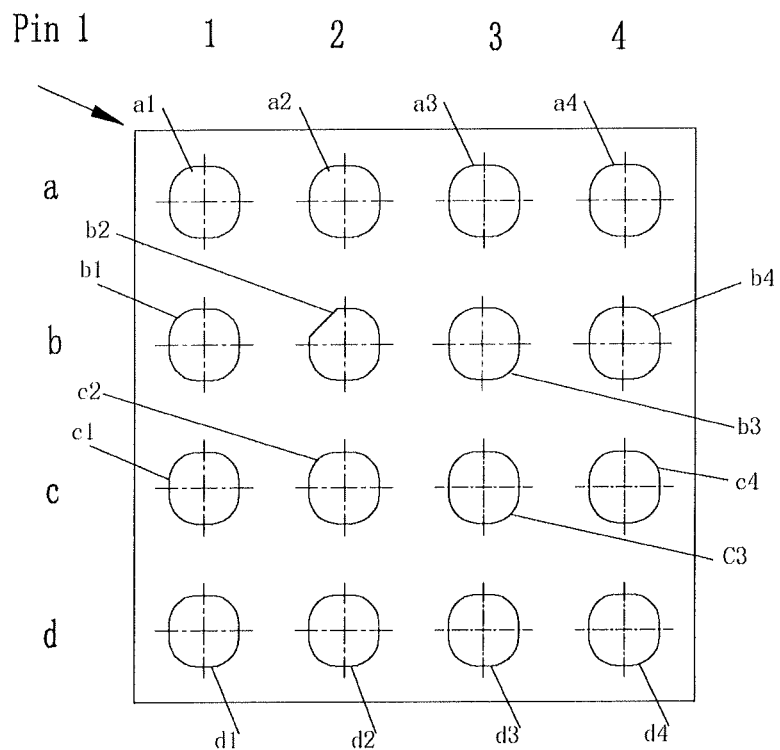
FIG. 6 is a bottom view of FIG. 4.
Figure 7:
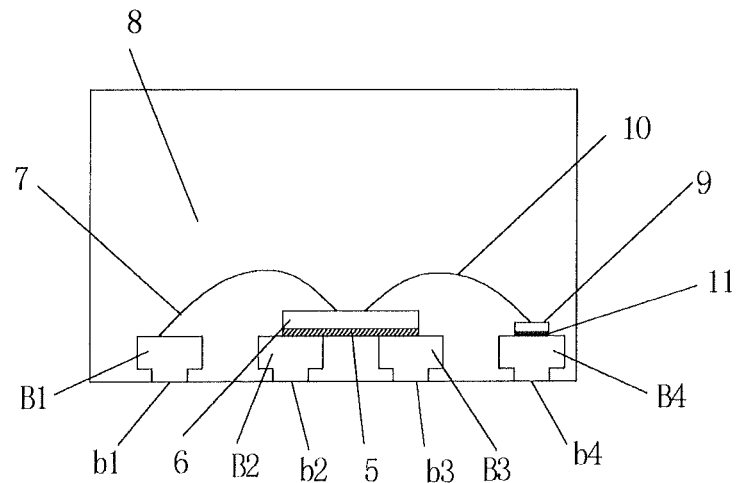
FIG. 7 is a schematic structural view of an embodiment showing multi-chip packaging of the IC chip package of the present invention.
Figure 8:
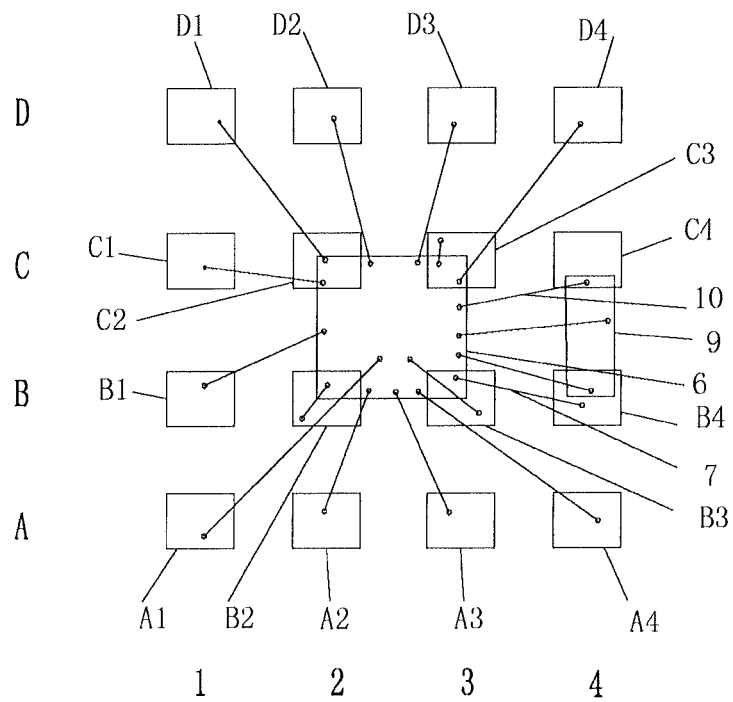
FIG. 8 is a top view of FIG. 7.
Figure 9:
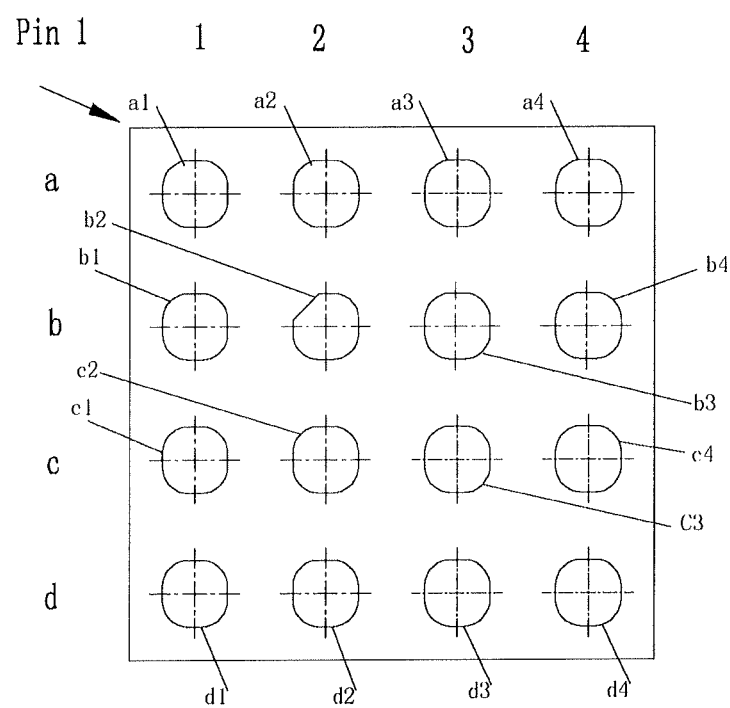
FIG. 9 is a bottom view of FIG. 7.

The list of reference numerals in the drawings: 1. first-column pin (protrusion), 2. second-column pin (protrusion), 3. third-column pin (protrusion), 4. fourth-column pin (protrusion); 5. adhesive film sheet, 6. IC chip 1, 7. bonding wire, 8. mold cap, 9. IC chip 2, 10. bonding wire between chips, 11. second adhesive film sheet; A. first-row inner pin, B. second-row inner pin, C. third-row inner pin, D. fourth-row inner pin; a. first-row gold-plated protrusion, b. second-row gold-plated protrusion, c. third-row gold-plated protrusion, d. fourth-row gold-plated protrusion.

DETAILED DESCRIPTION OF THE INVENTION

The present invention is described in detail with reference to the accompanying drawings and the embodiments.

A carrier-free LGA IC chip package includes an inner pin, an adhesive film sheet, an IC chip (single or dual), multiple bonding wires, a mold cap, and exposed multi-row approximate square-shaped circular gold-plated contacts. An L/F of the package is carrier-free. The chip is provided on the inner pin, the inner pin is adhered to the chip with the adhesive film sheet 5. If stacked packaging is performed, a layer of adhesive film sheet is further provided on the IC chip, and another IC chip is provided on the adhesive film sheet. A pad on the original IC chip is connected to the inner pin or another IC chip by the bonding wire, so as to form a current and signal channel of a circuit. The mold cap encircles the adhesive film sheet, the IC chip, the bonding wires, and an edge of the inner pin, so as to form the whole circuit. Moreover, the mold cap protects and supports the multiple bonding wires, the IC chip, and the approximate square-shaped circular gold-plated contacts. The IC chip on the adhesive film sheet at the bottom layer is completely supported by the inner pin. The package has forms of single-chip package, multi-chip package, and stacked package.

The present invention adopts a carrier-free matrix multi-contact L/F, which is a carrier-free matrix multi-contact frame.

The dimension of the typical three-row circular gold-plated contact (NLGA9) package of the present invention is as follows:

the length of the mold cap: 1.50±0.05; the width of the mold cap: 1.50±0.05;

the thickness of the mold cap: 0.75±0.05; the mounting height: 0.02±0.01;

the width of the pin: 025±0.05; the thickness of the pin: 0.20 REF; and the interval between the pins: 0.50 BSC.

Because the package uses the carrier-free L/F, the post mold curing, marking, and packing are the same as those in common QFN production, and a production method of the rest processes are as follows:

A. Single-Chip Packaging

1. Grinding and Sawing

First a wafer is ground to the thickness of 150 μm-200 μm, cleaned and dried, and then an adhesive film sheet is adhered at the back; a grinding adhesive film is removed; then the wafer adhered with the adhesive film sheet is sawed into single chips, where only the adhesive film sheet layer is cut thoroughly without hurting a protective layer.

2. Die Bonding

An NLGA9L-dedicated frame and an adhesive film sheet are used. On a dedicated die bonder, the L/F is automatically delivered to a track of the die bonder, and the chip is automatically placed at edges of the inner pins B1 and B2 as well as several other inner pins B3, A1, A2, A3, C1, C2, and C3. For the typical three-row pins, because the NLGA frame is carrier-free, the chip with the adhesive film sheet is adhered to the edges of the dual pins (for example, NLGA9L, B1, B2, B3) at the row B and several other pins (for example, NLGA9L, A1, A2, A3, C1, C2, C3), and is firmly adhered after baking.

3. Wiring Bonding

Because the IC chip 6 is adhered to the inner pins, the pad on the IC chip 6 is close to the inner pin solder joints; as a result, a common QFN bonding process cannot be used, and short-wire low-loop bonding can be merely adopted, wiring bonding parameters being as follows:

the pre-heat temperature: 130° C., and the heating temperature: 150° C.;

for a first solder joint, namely, the pad on the chip, the soldering time (ms): 3-10;

a soldering force (mN) of the first solder joint: 100-150 (in a common QFN wiring bonding, being 120-300);

soldering power (%) of the first solder joint: 15-28;

for a second solder joint, namely an inner pin, the soldering time (ms): 4-10;

a soldering force (mN) of the second solder joint (the inner pin): 450-800 (in a common QFN wiring bonding, being 600-1000);

power (%) of the second solder joint, namely, the inner pin: 110-160; and the length (mm) of the shortest bonding wire: 0.5-0.6 (in a common QFN product, being 0.6-0.8).

4. Molding

Because the short-wire low-loop bonding is adopted and the wire is pulled tightly, the molding cannot be performed according to a common QFN molding process, and a CEL9220 environmental-protection molding compound is used. After the Design of Experiment (DOE) test, the molding process parameters are finally determined as follows:

the mold temperature (° C.): 175±10; the clamping pressure (MPa): 40-120; the injection pressure (Ton): 0.80-1.80; the injection time (sec): 10±2; the curing time (sec): 90±30; and the post mold curing: 150° C., 7 h.

5. Marking

A conventional QFN laser marking process is adopted.

6. Plating

The L/F uses gold-plated contacts, and electroplating is not required.

7. Cutting

A dedicated NLGA-01 (three-row pins) or NLGA-02 (multi-row pins) cutting fixture of the product is used, and the cutting is performed according to the common QFN cutting process.

B. Dual-Chip Stacking Packaging

The grinding, sawing, marking, and cutting in the dual-chip stacked packaging are the same as those in single-chip packaging; matrix gold-plated contacts are used, and electroplating is not adopted.

1. Grinding and Sawing

First a wafer is ground to the thickness of 100 μm-150 μm, cleaned and dried, and then an adhesive film sheet is adhered at the back; a grinding adhesive film is removed; then the wafer adhered with the adhesive film sheet is sawed into single chips, where a sawing depth parameter is adjusted according to a sum of the thickness of the ground wafer and the adhesive film thickness of the adhesive film sheet, only the adhesive film sheet layer is cut thoroughly without hurting a protective layer.

2. Die Bonding

The chip is automatically set at a position of the corresponding L/F inner pin on a dedicated die bonder of the adhesive film sheet, and is heated; then the IC chip 6 is adhered to edges of the inner pins at the middle row and several other inner pins. For the typical four-row pins, because the NLGA frame is carrier-free, the chip with the adhesive film sheet is adhered to edges of the pins (for example, NLGA16L, B2, B3, C2, C3) at the rows B and C. After the first-time die bonding is completed, the same way is applied, and an IC chip 9 is adhered to pins B4 and C4 and is firmly adhered after baking.

3. Wiring Bonding

Because the IC chip 6 is adhered to the inner pins, the pad is close to the inner pin solder joints; in addition, in the dual-chip stacked packaging, the IC chip 9 is adhered to the IC chip 6 and a bonding wire is further required between the IC chip 9 and the IC chip 6; therefore, a short-wire low-loop bonding wire and a reverse wiring can be merely used. The wiring bonding parameters are as follows:

the pre-heat temperature: 130° C., and the heating temperature: 150° C.;

for a first solder joint (the pad on the chip), the soldering time (ms): 3-10;

a soldering force (mN) of the first solder joint: 100-150 (in a common QFN wiring bonding, being 120-300);

soldering power (%) of the first solder joint: 15-28;

for a second solder joint (an inner pin), the soldering time (ms): 4-10;

a soldering force (mN) of the second solder joint (the inner pin): 450-800 (in a common QFN wiring bonding, being 600-1000);

power (%) of the second solder joint (the inner pin): 110-160; and the length (mm) of the shortest bonding wire: 0.5-0.6 (in a common QFN product, being 0.6-0.8).

4. Molding

In the dual-chip stacked packaging, a bonding wire is further required between the IC chip 9 and the IC chip 6. In an injection procedure of the molding, the flowing of the molding compound and wire sweep are greatly different from those in the single chip, and the molding process parameters need to be constantly adjusted and optimized through the process test to achieve an optimal result without wire sweep, broken wire and delaminating.

The molding process parameters are as follows:

the mold temperature (° C.): 175±10; the clamping pressure (MPa): 40-120; the injection pressure (Ton): 0.80-1.33; the injection time (sec): 10±2; the curing time (sec): 90±30; and the post mold curing: 150° C., 7 h.

C. Multi-Chip Packaging

The grinding, sawing, marking, and cutting in the multi-chip packaging are the same as those in single-chip packaging; a matrix L/F uses gold-plated contacts, and electroplating is not required.

1. Die Bonding

The chip is automatically set at a position of the corresponding L/F inner pin on a dedicated die bonder of the adhesive film sheet, and is heated; then the IC chip 6 is adhered to edges of the inner pins at the middle row and several other inner pins. For the typical four-row pins, because the NLGA frame is carrier-free, the IC chip 6 with the adhesive film sheet is adhered to the pins (for example, NLGA16L, B2, B3, C2 and C3) at the rows B and C, and the IC chip 9 with the adhesive film sheet is adhered to edges of the pins B4 and C4.

2. Wiring bonding

Because the IC chip 6 is adhered to the inner pins, the pad on the IC chip 6 is close to the inner pin solder joints; as a result, a common QFN bonding process cannot be used, and a short-wire low-loop bonding wire and a reverse wiring can be merely used. The wiring bonding parameters are as follows:

the pre-heat temperature: 130° C., and the heating temperature: 150° C.;

for a first solder joint (the pad on the chip), the soldering time (ms): 3-10;

a soldering force (mN) of the first solder joint: 100-150 (in a common QFN wiring bonding, being 120-300);

soldering power (%) of the first solder joint: 15-28;

for a second solder joint (an inner pin), the soldering time (ms): 4-10;

a soldering force (mN) of the second solder joint (the inner pin): 450-800 (in a common QFN wiring bonding, being 600-1000);

power (%) of the second solder joint (the inner pin): 110-160; and the length (mm) of the shortest bonding wire: 0.5-0.6 (in a common QFN product, being 0.6-0.8).

3. Molding

In the dual-chip stacked packaging, a bonding wire is further required between the IC chip 9 and the IC chip 6. In an injection procedure of the molding, the flowing of the molding compound and the wire sweep are greatly different from those in the single chip, and the molding process parameters need to be constantly adjusted and optimized through the process test to achieve an optimal result without wire sweep, broken wire and delaminating. The molding process parameters are as follows:

the mold temperature (° C.): 175±10; the clamping pressure (MPa): 40-120; the injection pressure (Ton): 0.80-1.33; the injection time (sec): 10±2; the curing time (sec): 90±30; and the post mold curing: 150° C., 7 h.

Embodiment 1

Single-Chip Packaging

1. Grinding and Sawing

First a wafer is ground to the thickness of 150 μm, cleaned and dried, and then an adhesive film sheet is adhered at the back; a grinding adhesive film is removed; then the wafer adhered with the adhesive film sheet is sawed into single chips, where only the adhesive film sheet layer is cut thoroughly without hurting a protective layer.

2. Die Bonding

An NLGA9L-dedicated frame and an adhesive film sheet are used. On a dedicated die bonder, the L/F is automatically delivered to a track of the die bonder, and the chip is automatically placed at edges of the inner pins B1 and B2 as well as several other inner pins B3, A1, A2, A3, C1, C2, and C3. For the typical three-row pins, because the NLGA frame is carrier-free, the chip with the adhesive film sheet is adhered to edges of the dual pins (for example, NLGA9L, B1, B2, B3) at the row B and several other pins (for example, NLGA9L, A1, A2, A3, C1, C2, C3), and is firmly adhered after baking.

3. Wiring Bonding

Because the IC chip 6 is adhered to the inner pins, the pad on the IC chip 6 is close to the inner pin solder joints, and short-wire low-loop bonding is adopted. The wiring bonding parameters are as follows:

the pre-heat temperature: 130° C., and the heating temperature: 150° C.;

for a first solder joint (the pad on the chip), the soldering time (ms): 9;

a soldering force (mN) of the first solder joint: 120 (in a common QFN wiring bonding, being 120-300);

soldering power (%) of the first solder joint: 21;

for a second solder joint (an inner pin), the soldering time (ms): 8;

a soldering force (mN) of the second solder joint (the inner pin): 650 (in a common QFN wiring bonding, being 600-1000); and power (%) of the second solder joint (the inner pin): 125.

4. Molding

Because the short-wire low-loop bonding is adopted and the bonding wire is pulled tightly, the molding cannot be performed according to a common QFN molding process to obtain an expected effect without wire sweep, broken wire and delaminating. A CEL9220 environmental protection molding compound is used, and the molding process parameters are as follows:

the mold temperature (° C.): 175; the clamping pressure (MPa): 120; the injection pressure (Ton): 1.0; the injection time (sec): 12; the curing time (sec): 90; and the post mold curing: 150° C., 7 h.

5. Marking

A common QFN laser marking process is adopted.

6. Plating

The L/F uses gold-plated contacts, and electroplating is not required.

7. Cutting

A dedicated NLGA-01 (three-row pins)/02 (multi-row pins) cutting fixture of the product is used, and the cutting is performed according to the common QFN cutting process.

Embodiment 2

Dual-chip Stacked Packaging

The grinding, sawing, marking, and cutting in the dual-chip stacked packaging are the same as those in single-chip packaging; matrix gold-plated contacts are used, and electroplating is not adopted.

1. Grinding and Sawing

First a wafer at a lower layer is ground to the thickness of 200 μm, a wafer at an upper layer is ground to the thickness of 100 μm; the wafers are cleaned and dried, and then an adhesive film sheet is adhered at the back; a grinding adhesive film is removed. Then the wafer adhered with the adhesive film sheet is sawed into single chips, where a sawing depth parameter is adjusted according to a sum of the thickness of the ground wafer and the adhesive film thickness the adhesive film sheet, only the adhesive film sheet layer is cut thoroughly without hurting a protective layer.

2. Die Bonding

The chip is automatically set at a position of the corresponding L/F inner pin on a dedicated die bonder of the adhesive film sheet, and is heated; then the IC chip 6 is adhered to edges of the inner pins at the middle row and several other inner pins. For the typical four-row pins, because the NLGA frame is carrier-free, the chip with the adhesive film sheet is adhered to edges of the inner pins (for example, NLGA16L, B2, B3, C2, C3) at the rows B and C. After the first-time die bonding is fully completed, the same way is applied, and an IC chip 9 is adhered to pins B4 and C4 and is firmly adhered after baking.

3. Wiring Bonding

Because the IC chip 6 is adhered to the inner pins, the pad is close to the inner pin solder joints; in addition, in the dual-chip stacking packaging, the IC chip 9 is adhered to the IC chip 6 and a bonding wire is required between the IC chip 9 and the IC chip 6; therefore, a short-wire low-loop bonding wire and a reverse wiring can be merely used. The wiring bonding parameters are as follows:

the pre-heat temperature: 130° C., and the heating temperature: 150° C.;

for a first solder joint (the pad on the chip), the soldering time (ms): 8;

a soldering force (mN) of the first solder joint: 110 (in common QFN wiring bonding, being 120-300);

soldering power (%) of the first solder joint: 20;

for a second solder joint (an inner pin), the soldering time (ms): 6;

a soldering force (mN) of the second solder joint (the inner pin): 550 (in a common QFN wiring bonding, being 600-1000);

power (%) of the second solder joint (the inner pin): 130.

4. Molding

In the dual-chip stacked packaging, a bonding wire is required between the IC chip 9 and the IC chip 6, the injection procedure of the molding is further required. The molding process parameters are as follows:

the mold temperature (° C.): 175; the clamping pressure (MPa): 45; the injection pressure (Ton): 0.90; the injection time (sec): 9; the curing time (sec): 90; and the post mold curing: 150° C., 7 h.

5. Marking

A common QFN laser marking process is adopted.

6. Plating

The L/F uses gold-plated contacts, and electroplating is not required.

7. Cutting

A dedicated NLGA-01 (three-row pins)/02 (multi-row pins) cutting fixture of the product is used, and the cutting is performed according to the ordinary QFN cutting process.

Embodiment 3

Multi-Chip Packaging

The grinding, sawing, marking, and cutting in the multi-chip packaging are the same as those in single-chip packaging; a matrix L/F uses gold-plated contacts, and electroplating is not required.

1. Grinding and Sawing

The same as those in Embodiment 1.

2. Die Bonding

The chip is automatically set at a position of the corresponding L/F inner pin on a dedicated die bonder of the adhesive film sheet, and is heated; then the IC chip 6 is adhered to edges of the inner pins at the middle row and several other inner pins. For the typical four-row pins, because the NLGA frame is carrier-free, the IC chip 6 with the adhesive film sheet is adhered to the pins (for example, NLGA16L, B2, B3, C2 and C3) at the rows B and C, and the IC chip 9 with the adhesive film sheet is adhered to edges of the pins B4 and C4.

3. Wiring Bonding

Because the IC chip 6 is adhered to the inner pins, the pad on the IC chip 6 is close to the inner pin solder joints; as a result, a common QFN bonding process cannot be used, and a short-wire low-loop bonding wire and a reverse wiring can be merely used. The wiring bonding parameters are as follows:

the pre-heat temperature: 130° C., and the heating temperature: 150° C.;

for a first solder joint (the pad on the chip), the soldering time (ms): 9;

a soldering force (mN) of the first solder joint: 125 (in a common QFN wiring bonding, being 120-300);

soldering power (%) of the first solder joint: 23;

for a second solder joint (an inner pin), the soldering time (ms): 8;

a soldering force (mN) of the second solder joint (the inner pin): 650 (in a common QFN wiring bonding, being 600-1000);

power (%) of the second solder joint (the inner pin): 140.

4. Molding

In the dual-chip stacking packaging, a bonding wire is further required between the IC chip 9 and the IC chip 6, the injection procedure of the molding is further required. The molding process parameters are as follows:

the mold temperature (° C.): 175; the clamping pressure (MPa): 50; the injection pressure (Ton): 1.1; the injection time (sec): 12; the curing time (sec): 90; and the post mold curing: 150° C., 7 h.

5. Marking

The same as that in Embodiment 1.

6. Plating

The same as that in Embodiment 1.

7. Cutting

The same as that in Embodiment 1.

Embodiment 4

Single-Chip Packaging

1. Grinding and Sawing

First a wafer at a lower layer is ground to the thickness of 200 μm, cleaned and dried, and then an adhesive film sheet is adhered at the back; a grinding adhesive film is removed; then the wafer adhered with the adhesive film sheet is sawed into single chips, where only the adhesive film sheet layer is cut thoroughly without hurting a protective layer.

2. Die Bonding

An NLGA9L-dedicated frame and an adhesive film sheet are used. On a dedicated die bonder, the L/F is automatically delivered to a track of the die bonder, and the chip is automatically placed at edges of the inner pins B1 and B2 as well as several other inner pins B3, A1, A2, A3, C1, C2, and C3. For the typical three-row pins, because the NLGA frame is carrier-free, the chip with the adhesive film sheet is adhered to edges of the dual pins (for example, NLGA9L, B1, B2, B3) at the row B and several other pins (for example, NLGA9L, A1, A2, A3, C1, C2, C3), and is firmly adhered after baking.

3. Wiring Bonding

Because the IC chip 6 is adhered to the inner pins, the pad on the IC chip 6 is close to the inner pin solder joints; therefore, a common QFN bonding process cannot be adopted and merely a short-wire low-loop bonding can be adopted (a special bonding wire is used in the method of the present invention); in this way, the complexity is high, and key problems need to be tackled and solved through test in cooperation with the molding process. The wiring bonding parameters are as follows:

the pre-heat temperature: 130° C., and the heating temperature: 150° C.;

for a first solder joint (the pad on the chip), the soldering time (ms): 8.5;

a soldering force (mN) of the first solder joint: 110 (in a common QFN wiring bonding, being 120-300);

soldering power (%) of the first solder joint: 23;

for a second solder joint (an inner pin), the soldering time (ms): 8;

a soldering force (mN) of the second solder joint (the inner pin): 650 (in a common QFN wiring bonding, being 600-1000); and power (%) of the second solder joint (the inner pin): 135.

4. Molding

Because the short-wire low-loop bonding is adopted and the bonding wire is pulled tightly, the molding cannot be performed according to a common QFN molding process, and should be performed in cooperation with the bonding process. The process parameters are adjusted through research trials to obtain an expected effect without wire sweep, broken wire and delaminating. A CEL9220 environmental-protection molding compound is used, and the molding process parameters are as follows:

the mold temperature (° C.): 180; the clamping pressure (MPa): 120; the injection pressure (Ton): 1.20; the injection time (sec): 10; the curing time (sec): 120; and the post mold curing: 150° C., 7 h.

5. Marking

A common QFN laser marking process is adopted.

6. Plating

The L/F uses gold-plated contacts, and electroplating is not required.

7. Cutting

A dedicated NLGA-01 (three-row pins)/02 (multi-row pins) cutting fixture of the product is used (please provide the model of the dedicated cutting fixture), and the cutting is performed according to the common QFN cutting process.

Embodiment 5

Dual-Chip Stacked Packaging

1. Grinding and Sawing

First a wafer at a lower layer is ground to the thickness of 150 μm, a wafer at an upper layer is ground to the thickness of 100 μm; the wafers are cleaned and dried, and then an adhesive film sheet is adhered at the back; a grinding adhesive film is removed. Then the wafer adhered with the adhesive film sheet is sawed into single chips, where a sawing depth parameter is adjusted according to a sum of the thickness of the ground wafer and the adhesive film thickness of the adhesive film sheet, only the adhesive film sheet layer is cut thoroughly without hurting a protective layer.

2. Die Bonding

The chip is automatically set at a position of the corresponding L/F inner pin on a dedicated die bonder of the adhesive film sheet, and is heated; then the IC chip 6 is adhered to edges of the inner pins at the middle row and several other inner pins. For the typical four-row pins, because the NLGA frame is carrier-free, the chip with the adhesive film sheet is adhered to edges of the inner pins (for example, NLGA16L, B2, B3, C2, C3) at the rows B and C. After the first-time die bonding is completed, the same way is applied, and an IC chip 9 is adhered to pins B4 and C4 and is firmly adhered after baking.

3. Wiring bonding

Because the IC chip 6 is adhered to the inner pins, the pad is close to the inner pin solder joints; in addition, in the dual-chip stacked packaging, the IC chip 9 is adhered to the IC chip 6, and a bonding wire is further required between the IC chip 9 and the IC chip 6; therefore, a short-wire low-loop bonding wire and a reverse wiring can be merely used. The wiring bonding parameters are as follows:

the pre-heat temperature: 130° C., and the heating temperature: 150° C.;

for a first solder joint (the pad on the chip), the soldering time (ms): 9;

a soldering force (mN) of the first solder joint: 135 (in a common QFN wiring bonding, being 120-300);

soldering power (%) of the first solder joint: 25;

for a second solder joint (an inner pin), the soldering time (ms): 10;

a soldering force (mN) of the second solder joint (the inner pin): 700 (in a common QFN wiring bonding, being 600-1000); and power (%) of the second solder joint (the inner pin): 145.

4. Molding

In the dual-chip stacked packaging, a bonding wire is further required between the IC chip 9 and the IC chip 6. In an injection procedure of the molding, the flowing of the molding compound and the wire sweep are greatly different from those in the single chip, and the molding process parameters need to be constantly adjusted and optimized through the process test to achieve an optimal result without wire sweep, broken wire and delaminating. The molding process parameters are as follows:

the mold temperature (° C.): 180; the clamping pressure (MPa): 110; the injection pressure (Ton): 1.23; the injection time (sec): 8; the curing time (sec): 11; and the post mold curing: 150° C., 7 h.

5. Marking

A common QFN laser marking process is adopted.

6. Plating

The L/F uses gold-plated contacts, and electroplating is not required.

7. Cutting

A dedicated NLGA-01 (three-row pins)/02 (multi-row pins) cutting fixture of the product is used (please provide the model of the dedicated cutting fixture), and the cutting is performed according to the common QFN cutting process.

Embodiment 6

Multi-Chip Packaging

The grinding, sawing, marking, and cutting in the multi-chip packaging are the same as those in single-chip packaging; a matrix L/F uses gold-plated contacts, and electroplating is not required.

1. Grinding and Sawing

The same as those in Embodiment 5.

2. Die Bonding

The chip is automatically set at a position of the corresponding L/F inner pin on a dedicated die bonder of the adhesive film sheet, and is heated; then the IC chip 6 is adhered to edges of the inner pins at the middle row and several other inner pins. For the typical four-row pins, because the NLGA frame is carrier-free, the IC chip 6 with the adhesive film sheet is adhered to the pins (for example, NLGA16L, B2, B3, C2 and C3) at the rows B and C, and the IC chip 9 with the adhesive film sheet is adhered to edges of the pins B4 and C4.

3. Wiring Bonding

Because the IC chip 6 is adhered to the inner pins, the pad on the IC chip 6 is close to the inner pin solder joints; as a result, a common QFN bonding process cannot be used, and a short-wire low-loop bonding wire and a reverse wiring can be merely used. The wiring bonding parameters are as follows:

the pre-heat temperature: 130° C., and the heating temperature: 150° C.;

for a first solder joint (the pad on the chip), the soldering time (ms): 9;

a soldering force (mN) of the first solder joint: 138 (in a common QFN wiring bonding, being 120-300);

soldering power (%) of the first solder joint: 25;

for a second solder joint (an inner pin), the soldering time (ms): 9;

a soldering force (mN) of the second solder joint (the inner pin): 450-800 (in a common QFN wiring bonding, being 600-1000);

power (%) of the second solder joint (the inner pin): 150.

4. Molding

In the dual-chip stacking packaging, a bonding wire is further required between the IC chip 9 and the IC chip 6. In an injection procedure of the molding, the flowing of the molding compound and the wire sweep are greatly different from those in the single chip, and the molding process parameters need to be constantly adjusted and optimized through the process test to achieve an optimal result without wire sweep, broken wire and delaminating. The molding process parameters are as follows:

the mold temperature (° C.): 165; the clamping pressure (MPa): 100; the injection pressure (Ton): 1.20; the injection time (sec): 9; the curing time (sec): 100; and the post mold curing: 150° C., 7 h.

5. Marking

The same as that in Embodiment 5.

6. Plating

The same as that in Embodiment 5.

7. Cutting

The same as that in Embodiment 5.

What is claimed is:

1. A carrier-free land grid array (LGA) Integrated Circuit (IC) chip package, comprising inner pins, a first IC chip being a carrier-free LGA IC, a pad, a bonding wire, and a mold cap,
wherein the inner pins are configured to be pins of first, second and third rows at a front side of the package, and are configured to be exposed multi-row approximate square-shaped circular gold-plated contacts at a back side of the package,
three of the inner pins are disposed in the first row; two of the inner pins are disposed at the left side in the second row and are electrically connected to each other, and one of the inner pins is disposed at the right side in the second row; another three of the inner pins are disposed in the third row,
the first IC chip is provided on the inner pins, the inner pins are adhered to the first IC chip with an adhesive film sheet,
the pad on the first IC chip is connected to the inner pin by the bonding wire, and
the mold cap encircles the adhesive film sheet, the first IC chip, the bonding wire, and edges of the inner pin, so as to form a whole circuit,
wherein the contacts are disposed as follows:
three separate approximate square-shaped circular pin contacts of the same size are disposed in a first row at the back side of the package,
three separate approximate square-shaped circular contacts are disposed in a second row,
the contact disposed in a top left corner of the second row forming an oblique angle of 0.10×45°, and
the contact disposed in the first row directly facing the oblique angle being a first Pin of the circuit;
three separate approximate square-shaped circular contacts are further disposed in third row;
viewed from the back side, the nine contacts are disposed in a substantially symmetric way.

2. The carrier-free LGA IC chip package according to claim 1, wherein the package has a single-chip package form.

3. The carrier-free LGA IC chip package according to claim 1, wherein the package has a multi-chip package form.

4. The carrier-free LGA IC chip package according to claim 1, wherein the package has a dual-chip staked package form, a second IC chip is disposed on the first IC chip,
the adhesive film sheet is disposed between the first IC chips and to bind the first and second IC chips,
the pad on the first IC chip is connected to one of the inner pin or the first IC chip by the bonding wire, so as to form current and signal channels of the circuit;
the mold cap encircles the adhesive film sheets, the first and second IC chips, the bonding wires, and edges of the inner pins, to form the whole circuit.

5. A preparation method of the carrier-free LGA IC chip package according to claim 1, wherein the preparation method of the single-chip package comprises: wafer grinding, sawing, die bonding, wiring bonding, molding, post mold curing, marking, cutting and separation, inspection, packing, and putting in storage, the post mold curing, the marking, the packing, and the putting in storage being performed in a way the same as that in ordinary Quad Flat No-lead Package (QFN) production, and the rest operations are performed according to the following process steps:
grinding and sawing:
first grinding a wafer to the thickness of 150 µm-200 µm, cleaning and drying the wafer, and then adhering an adhesive film sheet at the back; removing a grinding adhesive film, and then sawing the wafer adhered with the adhesive film sheet into single chips, wherein only the adhesive film sheet layer is cut thoroughly without hurting a protective layer;
die bonding:
automatically setting the chip at a midpoint of an L/F position on a dedicated die bonder of the adhesive film sheet, the IC chip being adhered to edges of the inner pins at the row B and several other inner pins after heating, and baking to achieve firm adhesion;
wiring bonding:
in the current package, the pad on the IC chip being close to the inner pin solder joints; using a slightly bent bonding wire accordingly;
molding:
wherein process parameters is adjusted during molding so as to prevent a solder ball from dropping; the molding process parameters being as follows:
the mold temperature (° C.): 175±10; the clamping pressure (MPa): 40-120; the injection pressure (Ton): 0.80-1.33; the injection time (sec): 10±2; the curing time (sec): 90±30; and the post mold curing: 150° C., 7h; and
cutting:
using a dedicated NLGA1/NLGA2 cutting fixture of the product, and performing the cutting according to the common QFN cutting process.

6. The preparation method of the carrier-free LGA IC chip package according to claim 1, comprising: wafer grinding, sawing, die bonding, wiring bonding, molding, post mold curing, marking, cutting and separation, inspection, packing, and putting in storage; wherein the grinding, sawing, molding, marking, and cutting in multi-chip packaging are the same as those in the single-chip packaging, and the rest steps are as follows:
die bonding
automatically setting the chip at a position of the corresponding L/F inner pin on a dedicated die bonder of the adhesive film sheet, the IC chip being adhered to edges of the inner pins at the middle row and several other inner pins after heating, and baking to achieve firm adhesion; and
wiring bonding
using a lightly bent bonding wire, the process parameters being as follows:
the pre-heat temperature: 130° C., the heating temperature: 150° C.;
a first solder joint being the pad on the chip, the soldering time (ms): 3-10;
a soldering force (mN) of the first solder joint: 100-150;
soldering power (%) of the first solder joint: 15-28;
for a second solder joint, namely, an inner pin, the soldering time (ms): 4-10;
a soldering force (mN) of the second solder joint, namely, the inner pin: 450-800; and
soldering power (%) of the second solder joint: 110-160.

7. The preparation method of the carrier-free LGA IC chip package according to claim 1, wherein the grinding, sawing, marking, and cutting in dual-chip stacked packaging are the same as those in the single-chip packaging, and the rest steps are as follows:
die bonding:
automatically setting the chip at a position of the corresponding L/F inner pin on a dedicated die bonder of the adhesive film sheet, the first IC chip being adhered to edges of the inner pins at the middle row and several other inner pins after heating; after the first-time die bonding is completed, applying the same way on the first IC chip, and adhering a second IC chip with an adhesive film sheet to the first IC chip, and baking to achieve firm adhesion;

wiring bonding:

using a slightly bent bonding wire; and molding:

during an injection procedure of the molding, molding process parameters being as follows:

the mold temperature (° C.): 175±10; the clamping pressure (MPa): 40-120; the injection pressure (Ton): 0.80-1.33; the injection time (sec): 10±2; the curing time (sec): 90±30; and the post mold curing: 150° C., 7h.

* * * * *